(12) United States Patent
Kruiskamp

(10) Patent No.: US 6,617,922 B2
(45) Date of Patent: Sep. 9, 2003

(54) DIFFERENTIAL DIFFERENCE AMPLIFIER FOR AMPLIFYING SMALL SIGNALS CLOSE TO ZERO VOLTS

(75) Inventor: Marinus W. Kruiskamp, Hertogenbosch (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/162,171

(22) Filed: Jun. 3, 2002

(65) Prior Publication Data

US 2003/0011430 A1 Jan. 16, 2003

Related U.S. Application Data

(63) Continuation of application No. 09/716,547, filed on Nov. 20, 2000, now Pat. No. 6,400,225.

(51) Int. Cl.[7] .............................. H03F 3/45; H03F 3/04
(52) U.S. Cl. ..................... 330/253; 330/69; 330/260; 330/311; 327/307
(58) Field of Search .......................... 330/253, 69, 260, 330/311; 327/307

(56) References Cited

U.S. PATENT DOCUMENTS

| | | | | |
|---|---|---|---|---|
| 4,460,873 A | * | 7/1984 | Hester | 330/259 |
| 5,471,169 A | * | 11/1995 | Dendinger | 327/563 |
| 5,596,289 A | | 1/1997 | Liu | 327/67 |
| 5,861,778 A | | 1/1999 | Louagie et al. | 330/260 |
| 5,969,573 A | | 10/1999 | Koike | 330/253 |
| 6,002,299 A | | 12/1999 | Thomsen | 330/9 |
| 6,011,436 A | | 1/2000 | Koike | 330/253 |
| 6,057,972 A | * | 5/2000 | Castellucci | 360/66 |
| 6,111,437 A | | 8/2000 | Patel | 327/74 |
| 6,175,278 B1 | | 1/2001 | Hasegawa | 330/278 |

OTHER PUBLICATIONS

H. Alzahler and M. Ismail, "A CMOS Fully Balanced Differential Difference Amplifier and Its Application," IEEE Transactions on Circuits and Systems–II: Analog and Digital Signal Processing, vol. 48, pp. 614–620, Jun. 2001.

E. Lee, "Low–Voltage Opamp Design and Differential Difference Amplifier Design Using Linear Transconductor with Resistor Input," IEEE Transactions on Circuits and Systems– II; Analog and Digital Signal Processing, vol. 47, pp 776–778, Aug. 2000.

* cited by examiner

*Primary Examiner*—Patricia Nguyen
(74) *Attorney, Agent, or Firm*—Davis Munck, P.C.

(57) ABSTRACT

A differential difference amplifier is provided for amplifying an input signal having a magnitude close to zero (or a negative supply voltage) and adding an offset voltage to the amplified input signal.

20 Claims, 2 Drawing Sheets

DIFFERENTIAL DIFFERENCE AMPLIFIER FOR AMPLIFYING SMALL SIGNALS CLOSE TO ZERO VOLTS

This patent application is a continuation patent application of prior U.S. patent application Ser. No. 09/716,547 filed on Nov. 20, 2000, now U.S. Pat. No. 6,400,225.

TECHNICAL FIELD OF THE INVENTION

The present invention is generally directed to differential difference amplifiers and, more specifically, to a differential difference amplifier optimized for amplifying a small signal close to zero volts.

BACKGROUND OF THE INVENTION

In numerous applications, there is need to amplify a small input signal that is close to zero volts (0V) (or a negative supply voltage) and to add a fixed constant voltage to the result. FIG. 1 illustrates an exemplary battery monitoring circuit 100 in which a small voltage close to a zero volt reference is amplified and offset by a constant voltage. Battery monitoring circuit 100 comprises battery 105, sense resistor 110, scaler 115, analog-to-digital converter (ADC) 120 and load circuit 125. In an exemplary embodiment, load circuit 125 may be a cell phone that monitors battery 105 to determine if battery 105 is charging or discharging and to determine the rate at which battery 105 is charging or discharging.

The battery current generated by battery 105 is sensed over sense resistor 110, which is a very small resistor (about 0.1 ohm). During charging of battery 105, the input voltage to scaler 115 is positive. During discharge of battery 105, the input voltage to scaler 115 is negative. In both situations, the sense voltage is very small (typical range is −100 mV to +100 mV, but −10 mV to +10 mV also is a possible range). This small sense voltage has to be scaled and amplified to a signal that can be used in by ADC 120. Scaler 115 typically amplifies the sense voltage by a factor of 10 or 100 and add the mid-level voltage of ADC 120 to the amplified signal. The digitized sense voltage at the output of ADC 120 is then read by processing circuits in the cell phone (i.e., load circuit 125) to determine the state of battery 105. It should be noted that there are many other applications in which scaler 115 performs a similar amplification and offset function.

Scaler 115 must have a high ohmic input so that a low-pass filter (e.g., a 1M resistor and a 1 µF capacitor) may be added between the sense voltage and scaler 115. In that way, the average battery current can be measured. One approach implementing scaler 115 is to use a standard non-inverting operation amplifier (op amp) having a first resistor, R1, with a first terminal coupled to the negative input of the op amp and a feedback resistor, R2, coupled between the negative input and the output. Two level shifters are used to add a constant voltage (typical half the supply voltage: Vdd/2)) to the positive input of the op amp and to the second terminal of the first resistor, R1. In this approach, the input signal of the op amp is always positive. The transfer function from input to output voltage of such a circuit is:

$$Vout = Vdd/2 + ((R1+R2)/R1)Vin$$

Unfortunately, this approach requires very accurate level shifters. Mismatch and non-linearity in the level shifters directly affects the accuracy of the overall scaling. The level shifters must be able to be used with a high impedance input of the scaler, which reduces the number of possible circuits.

There is therefore a need in the art for improved circuits that are capable of monitoring small voltages close to zero volts (or a negative supply rail). There is a further need for improved amplification circuits that amplify a small input signal close to zero volts (0V) (or a negative supply voltage) and add a fixed offset voltage to the result.

SUMMARY OF THE INVENTION

To address the above-discussed deficiencies of the prior art, it is a primary object of the present invention to provide a differential difference amplifier for amplifying an input signal close to a negative supply voltage and adding an offset voltage to the amplified input signal. According to an advantageous embodiment of the present invention, the differential difference amplifier comprises: 1) a first non-inverting input terminal capable of being coupled to the input signal; 2) a first inverting input terminal capable of being coupled to the negative supply voltage; 3) a second inverting input terminal capable of being coupled to a feedback resistor coupled to an output of the differential difference amplifier; 4) a second non-inverting input terminal capable of being coupled to the offset voltage; 5) a first differential transistor pair comprising a first transistor having a gate coupled to the first non-inverting input and a second transistor having a gate coupled to the first inverting input; 6) a second differential transistor pair comprising a third transistor having a gate coupled to the second non-inverting input and fourth transistor having a gate coupled to the second inverting input; 7) a first cascode transistor pair comprising a fifth transistor having a gate coupled to the first non-inverting input and a source coupled to a drain of the first transistor and a sixth transistor having a gate coupled to the first inverting input and a source coupled to a drain of the second transistor; and 8) a second cascode transistor pair comprising a seventh transistor having a gate coupled to the second non-inverting input and a source coupled to a drain of the third transistor and an eighth transistor having a gate coupled to the second inverting input and a source coupled to a drain of the fourth transistor.

According to one embodiment of the present invention, a source of the first transistor and a source of the second transistor are coupled to the output of a first bias current generating source.

According to another embodiment of the present invention, a bulk connection of the first transistor and a bulk connection of the second transistor are coupled to the offset voltage.

According to still another embodiment of the present invention, a bulk connection of the fifth transistor and a bulk connection of the sixth transistor are coupled to the sources of the first and second transistors.

According to yet another embodiment of the present invention, a source of the third transistor and a source of the fourth transistor are coupled to the output of a second bias current generating source.

According to a further embodiment of the present invention, a bulk connection of the third transistor and a bulk connection of the fourth transistor are coupled to a positive supply voltage.

According to a still further embodiment of the present invention, a bulk connection of the seventh transistor and a bulk connection of the eighth transistor are coupled to the sources of the third and fourth transistors.

According to a yet further embodiment of the present invention, a drain current of the fifth transistor and a drain current of the seventh transistor are combined to produce a first composite current.

In one embodiment of the present invention, a drain current of the sixth transistor and a drain current of the eighth transistor are combined to produce a second composite current.

In another embodiment of the present invention, a current difference detection circuit capable of detecting a current difference in the first and second composite currents and generating an output voltage proportional to the current difference.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged differential difference amplifier.

Figure 1:
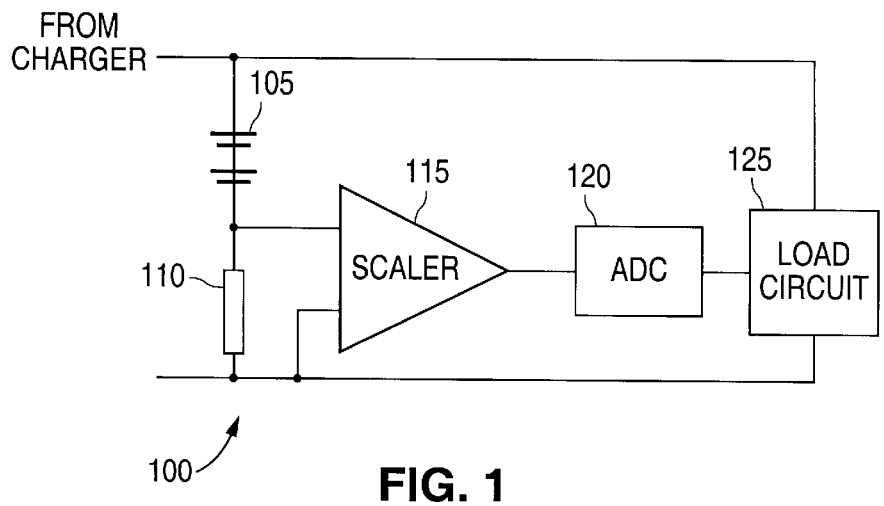
FIG. 1 illustrates an exemplary battery monitoring circuit in which a small voltage close to a zero volt reference is amplified and offset by a constant voltage.
Figure 2:
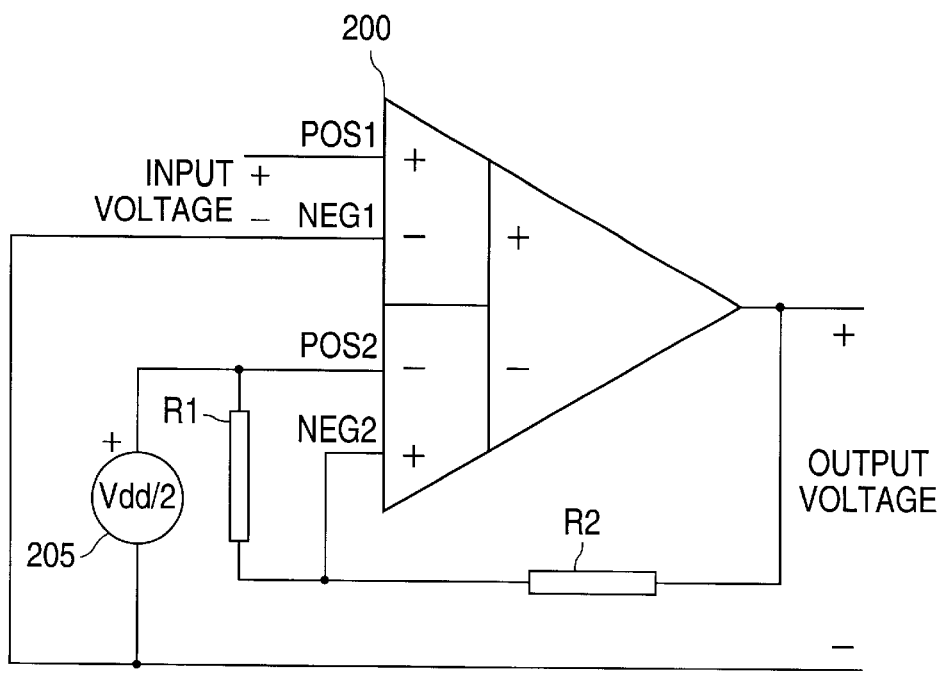
FIG. 2 illustrates a differential difference amplifier and biasing circuitry capable of amplifying a small voltage close to zero volts and adding an offset voltage to the result according to one embodiment of the present invention.

FIG. 2 illustrates differential difference amplifier 200 and biasing circuitry capable of amplifying a small voltage close to zero volts and adding an offset voltage to the result according to one embodiment of the present invention. The biasing circuitry comprises input resistor R1 and feedback resistor R2 and voltage offset circuit 205, which generates an offset voltage equal to one half of the supply voltage (i.e., Vdd/2). The small input voltage that appears across sense resistor 110 in FIG. 1 is applied to a first differential input pair (POS1 and NEG1) of differential difference amplifier 200. Input resistor R1 is coupled between a second differential input pair (POS2 and NEG2) of differential difference amplifier 200. Feedback resistor R2 is coupled between the output of differential difference amplifier 200 and the NEG2 input.

With the circuit configuration shown in FIG. 2, the required scaler 115 function is obtained:

$$Vout=Vdd/2+((R1+R2)/R1)Vin$$

Differential difference amplifier 200 makes it possible to implement scaler 115 with a high ohmic input. Differential difference amplifiers are described in detail in the following references:

1. A. Soliman, "The Differential Difference Operational Floating Amplifier: A New Block For Analog Signal Processing in MOS Technology," IEEE Transactions on Circuits and Systems II, Vol. 45, No. 1, pp. 148–158, January 1998; and
2. S. Huang, M. Ismail, S. Zarabadi, "A Wide Range Differential Difference Amplifier: A Basic Block For Analog Signal Processing in MOS Technology," IEEE Transactions on Circuits and Systems II, Vol. 40, No. 5, pp. 289–301, May 1993.

Figure 3:
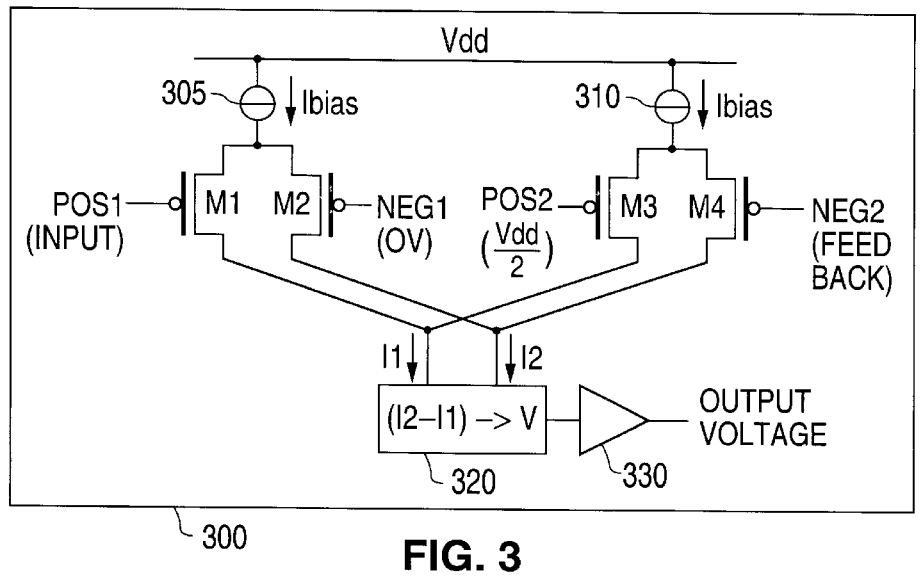
FIG. 3 illustrates in greater detail a differential difference amplifier according to one embodiment of the prior art.

FIG. 3 illustrates differential difference amplifier 300 in greater detail according to one embodiment of the prior art.

Prior art differential difference amplifier 300 comprises a first differential transistor pair (i.e., p-type MOS (PMOS) transistors M1 and M2) and a second differential transistor pair (i.e., p-type MOS (PMOS) transistors M3 and M4). Differential difference amplifier 300 further comprises current difference detector circuit 320 and amplifier 330. Current difference detector circuit 320 subtracts current I1 from current I2 and converts the current difference to a voltage difference signal. The voltage signal is then amplified by amplifier 330.

Bias current, Ibias, flows from bias current circuit 305 through transistors M1 and M2. The same bias current, Ibias, flows from bias current circuit 310 through transistors M3 and M4. When POS1 and NEG1 are equal, equal currents flow in transistors M1 and M2. However, when POS1 and NEG1 are not equal, the current increases in one of transistors M1 and M2 and correspondingly decreases in the other. Similarly, when POS2 and NEG2 are equal, equal currents flow in transistors M3 and M4. However, when POS2 and NEG2 are not equal, the current increases in one of transistors M3 and M4 and correspondingly decreases in the other. The currents in transistors M1 and M3 are combined to form the current I1 and the currents in transistors M2 and M4 are combined to form the current I2.

However, since the common mode level of the first differential pair (M1, M2) is zero volts (0V) and the common mode level of the second differential pair (M3, M4) is the half supply voltage (Vdd/2), the voltage-to-current relationship is not the same for the two differential pairs. The bulk effect and channel length modulation effect (drain-source resistance) of the input transistors make the relation non-linear and subject to process and temperature variation.

Figure 4:
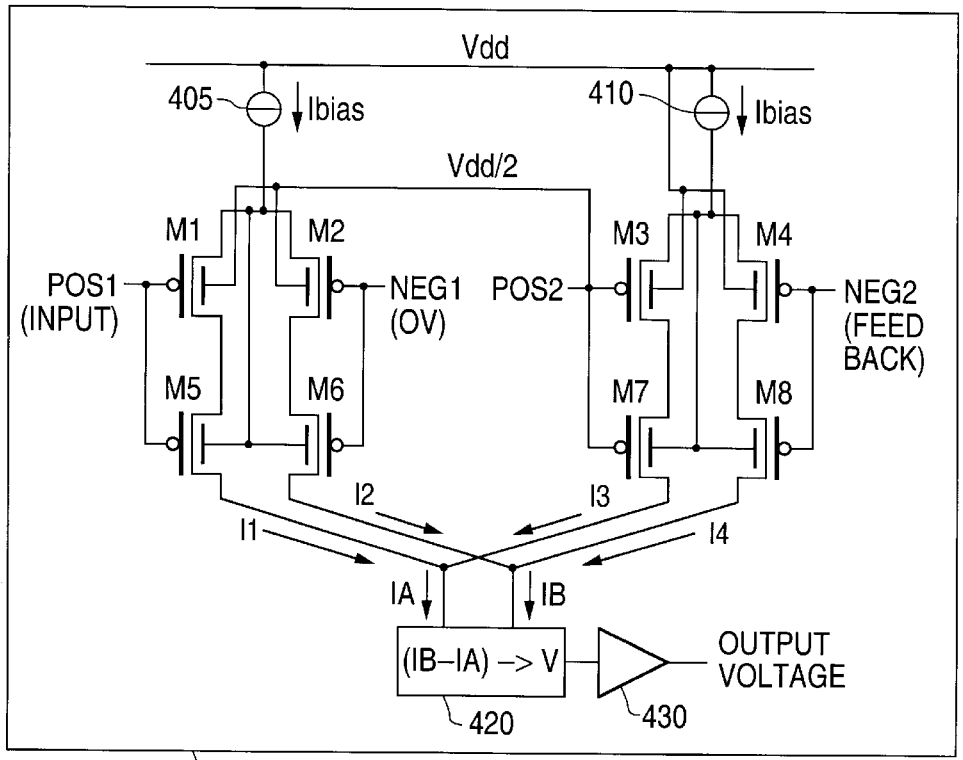
FIG. 4 illustrates in greater detail a differential difference amplifier according to one embodiment of the present invention.

FIG. 4 illustrates differential difference amplifier 200 in greater detail according to one embodiment of the present invention. Differential difference amplifier 200 comprises a first differential transistor pair (i.e., p-type MOS (PMOS) transistors M1 and M2) and a second differential transistor pair (i.e., p-type MOS (PMOS) transistors M3 and M4). Each of transistors M1 and M2 is in series with one of a pair of p-type MOS (PMOS) cascode transistors M5 and M6. Each of transistors M3 and M4 is in series with one of a pair of p-type MOS (PMOS) cascode transistors M7 and M8. Differential difference amplifier 200 further comprises current difference detector circuit 420 and amplifier 430. Current difference detector circuit 420 subtracts current IA from current IB and converts the current difference to a voltage difference signal. The voltage signal is then amplified by amplifier 430.

The gates of transistors M1 and M5 are coupled to the POS1 input of differential difference amplifier 200. The source of transistor M5 is connected to the drain of transistor M1. The gates of transistors M2 and M6 are coupled to the NEG1 input of differential difference amplifier 200. The drain of transistor M2 is connected to the source of transistor MG. The gates of transistors M3 and M7 are coupled to the POS2 input of differential difference amplifier 200 and are biased at Vdd/2 volts. The drain of transistor M3 is connected to the source of transistor M7. The gates of transistors M4 and M8 are coupled to the NEG2 feedback input of differential difference amplifier 200. The source of transistor M8 is connected to the drain of transistor M4.

The bulk connections on differential pair transistors M1 and M2 are coupled to the Vdd/2 volt bias. Similarly, the bulk connections on differential pair transistors M3 and M4 are coupled to the positive supply Vdd bias. Additionally, the bulk connections on the cascode transistors (M5, M6, M7, and M8) are lower in voltage than the bulk connections of the drive transistors (M1, M2, M3 and M4) since the bulk connections of the cascode transistors are connected to the sources of the drive transistors (M1, M2, M3 and M4).

Bias current, Ibias, flows from bias current circuit 405 through transistors M1, M2, MS and MG. The same bias current, Ibias, flows from bias current circuit 410 through transistors M3, M4, M7 and M8. When POS1 and NEG1 are equal, equal currents flow in drive transistors M1 and M2 and in cascode transistors MS and MG. However, when POS1 and NEG1 are not equal, the current increases in transistors M1 and MS or in transistors M2 and M6 and correspondingly decreases in the other pair of transistors. Similarly, when POS2 and NEG2 are equal, equal currents flow in drive transistors M3 and M4 and in cascode transistors M7 and M8. However, when POS2 and NEG2 are not equal, the current increases in transistors M3 and M7 or in transistors M4 and M8 and correspondingly decreases in the other pair of transistors. The current I1 from transistor MS and the current I3 from transistor M7 combine to form the current IA. The current I2 from transistor M6 and the current I4 from transistor M8 combine to form the current IB.

As noted above, the source-bulk voltage and the drain-source voltage are equal for both differential pairs. In this way, the bulk effect and the channel length modulation effect (drain-source resistance) do not have any negative effect on the performance of differential difference amplifier 200. The gain accuracy and linearity of scaler 115 are significantly better with the improved topology of differential difference amplifier 200. Only four extra transistors (i.e., cascode transistors M5 through M8) and proper bulk biasing are needed to get this improvement.

In FIG. 4, the cascode transistors MS, M6, M7 and M8 operate in weak-inversion (i.e., the gate-source voltage is smaller than the threshold voltage). Also, as noted above, the bulk connections of cascode transistors M5, M6, M7 and M8 are lower in voltage than the bulk connections of the corresponding drive transistors M1, M2, M3 and M4. These two conditions ensure that M1, M2, M3 and M4 operate in saturation, just as in the original circuit.

If the voltage gain is infinite and differential difference amplifier 200 operates in negative feedback, then IA=IB= Ibias. If the channel length modulation effect is neglected with respect to the cascode transistors M5, M6, M7 and M8, then it turns out that the terminal voltages of transistor M3 (gate, drain, source, bulk) are exactly Vdd/2 volt higher than the terminal voltages of transistor M2. The same applies to transistor M4 relative to transistor M1. This cancels the influence of the bulk effect and channel length modulation effect of transistors M1, M2, M3 and M4. The result is that the feedback voltage is exactly equal to Vdd/2 plus the input voltage.

The channel length modulation effect on transistors M5, M6, M7 and M8 has only a secondary effect on the overall transfer function compared to the channel length modulation effect on transistors M1, M2, M3 and M4. Thus, even if all non-ideal effects are taken into account, the gain error in differential difference amplifier 200 is significantly smaller than in prior art differential difference amplifier 300. In addition to the reduced gain error, differential difference amplifier 200 is less sensitive to variation in process and temperature than prior art differential difference amplifier 300.

Although the present invention has been described in detail, those skilled in the art should understand that they can make various changes, substitutions and alterations herein without departing from the spirit and scope of the invention in its broadest form.

What is claimed is:

1. A differential difference amplifier for amplifying an input signal close to a negative supply voltage and adding an offset voltage to the amplified input signal, said differential difference amplifier comprising:
   at least two differential transistor pairs;
   at least two cascode transistor pairs, wherein each cascode transistor is coupled in series with a corresponding differential transistor; and
   current difference detection circuitry that operates to (i) detect a current difference between a first composite current generated by a first at least two series pairs of transistors and a second composite current generated by a second at least two series pairs of transistors, and (ii) generate an output voltage proportional to said current difference.

2. The differential difference amplifier as set forth in claim 1 wherein a source of a first transistor and a source of a second transistor are coupled to the output of a first bias current generating source.

3. The differential difference amplifier as set forth in claim 2 wherein a bulk connection of said first transistor and a bulk connection of said second transistor are coupled to said offset voltage.

4. The differential difference amplifier as set forth in claim 3 wherein a bulk connection of a fifth transistor and a bulk connection of a sixth transistor are coupled to said sources of said first and second transistors.

5. The differential difference amplifier as set forth in claim 4 wherein a source of a third transistor and a source of a fourth transistor are coupled to the output of a second bias current generating source.

6. The differential difference amplifier as set forth in claim 5 wherein a bulk connection of said third transistor and a bulk connection of said fourth transistor are coupled to a positive supply voltage.

7. The differential difference amplifier as set forth in claim 6 wherein a bulk connection of a seventh transistor and a bulk connection of an eighth transistor are coupled to said sources of said third and fourth transistors.

8. The differential difference amplifier as set forth in claim 7 wherein a drain current of said fifth transistor and a drain current of said seventh transistor are combined to produce said first composite current.

9. The differential difference amplifier as set forth in claim 8 wherein a drain current of said sixth transistor and a drain current of said eighth transistor are combined to produce said second composite current.

10. The differential difference amplifier as set forth in claim 9 wherein (i) a first differential transistor pair comprises said first transistor having a gate coupled to a first non-inverting input and said second transistor having a gate coupled to a first inverting input; (ii) a second differential transistor pair comprising said third transistor having a gate coupled to a second non-inverting input and said fourth transistor having a gate coupled to a second inverting input; (iii) a first cascode transistor pair comprising said fifth transistor having a gate coupled to said first non-inverting input and a source coupled to a drain of said first transistor and said sixth transistor having a gate coupled to said first inverting input and a source coupled to a drain of said second transistor; and (iv) a second cascode transistor pair comprising said seventh transistor having a gate coupled to said second non-inverting input and a source coupled to a drain of said third transistor and said eighth transistor having a gate coupled to said second inverting input and a source coupled to a drain of said fourth transistor.

11. A battery monitoring apparatus comprising:
- a sensor coupled to a battery such that a charge current flows through said sensor when said battery is charging and a discharge current flows through said sensor when said battery is discharging;
- an offset voltage generation circuit capable of generating an offset voltage;
- a differential difference amplifier for amplifying a voltage sense signal on said sense resistor and adding said offset voltage to the amplified voltage sense signal, said differential difference amplifier comprising:
  - at least two differential transistor pairs;
  - at least two cascode transistor pairs, wherein each cascode transistor is coupled in series with a corresponding differential transistor; and
  - current difference detection circuitry that operates to (i) detect a current difference between a first composite current generated by a first at least two series pairs of transistors and a second composite current generated by a second at least two series pairs of transistors, and (ii) generate an output voltage proportional to said current difference; and
- an analog-to-digital converter coupled to an output of said differential difference amplifier that converts said amplified voltage sense signal and said offset signal to a digital signal readable by circuitry associated with said ADC.

12. The battery monitoring apparatus as set forth in claim 11 wherein a source of a first transistor and a source of a second transistor are coupled to the output of a first bias current generating source.

13. The battery monitoring apparatus as set forth in claim 12 wherein a bulk connection of said first transistor and a bulk connection of said second transistor are coupled to said offset voltage.

14. The battery monitoring apparatus as set forth in claim 13 wherein a bulk connection of a fifth transistor and a bulk connection of a sixth transistor are coupled to said sources of said first and second transistors.

15. The battery monitoring apparatus as set forth in claim 14 wherein a source of a third transistor and a source of a fourth transistor are coupled to the output of a second bias current generating source.

16. The battery monitoring apparatus as set forth in claim 15 wherein a bulk connection of said third transistor and a bulk connection of said fourth transistor are coupled to a positive supply voltage.

17. The battery monitoring apparatus as set forth in claim 16 wherein a bulk connection of a seventh transistor and a bulk connection of an eighth transistor are coupled to said sources of said third and fourth transistors.

18. The battery monitoring apparatus as set forth in claim 17 wherein a drain current of said fifth transistor and a drain current of said seventh transistor are combined to produce said first composite current.

19. The battery monitoring apparatus as set forth in claim 18 wherein a drain current of said sixth transistor and a drain current of said eighth transistor are combined to produce said second composite current.

20. The battery monitoring apparatus as set forth in claim 19 wherein (i) a first differential transistor pair comprises said first transistor having a gate coupled to a first non-inverting input and said second transistor having a gate coupled to a first inverting input; (ii) a second differential transistor pair comprising said third transistor having a gate coupled to a second non-inverting input and said fourth transistor having a gate coupled to a second inverting input; (iii) a first cascode transistor pair comprising said fifth transistor having a gate coupled to said first non-inverting input and a source coupled to a drain of said first transistor and said sixth transistor having a gate coupled to said first inverting input and a source coupled to a drain of said second transistor; and (iv) a second cascode transistor pair comprising said seventh transistor having a gate coupled to said second non-inverting input and a source coupled to a drain of said third transistor and said eighth transistor having a gate coupled to said second inverting input and a source coupled to a drain of said fourth transistor.

\* \* \* \* \*

UNITED STATES PATENT AND TRADEMARK OFFICE
CERTIFICATE OF CORRECTION

PATENT NO. : 6,617,922 B2
DATED : September 9, 2003
INVENTOR(S) : Marinus W. Kruiskamp It is certified that error appears in the above-identified patent and that said Letters Patent is hereby corrected as shown below:

Column 5,
Line 29, delete "MG" and insert -- M6 --;
Lines 46 and 50, delete "MS" and insert -- M5 -- and delete "MG" and insert -- M6 --;
Line 52, delete "MS" and insert -- M5 --;
Line 59, delete "MS" and insert -- M5 --;

Column 6,
Line 6, delete "MS" and insert -- M5 --.

Signed and Sealed this

Twentieth Day of September, 2005

JON W. DUDAS
*Director of the United States Patent and Trademark Office*